United States Patent

[11] 3,579,817

[72] Inventor Martin A. Boyle
Woodcliff Lake, N.J.
[21] Appl. No. 826,600
[22] Filed May 21, 1969
[45] Patented May 25, 1971
[73] Assignee Alpha Metals, Inc.
Jersey City, N.J.

[54] COVER FOR COPLANAR WALLS OF AN OPEN TOP CIRCUIT PACKAGE
11 Claims, 5 Drawing Figs.

[52] U.S. Cl. .......... 29/588, 174/52, 174/66, 317/101CP
[51] Int. Cl. .......... H01l 1/02
[50] Field of Search .......... 174/120 (FP), 52.5, 66; 317/101 (A), 101 (CP), 234 (C); 29/588—590

[56] References Cited

UNITED STATES PATENTS

| | | | |
|---|---|---|---|
| 3,187,240 | 6/1965 | Clark | 174/120(FP) |
| 3,335,336 | 8/1967 | Urushida et al. | 174/120(FP) |
| 3,340,348 | 9/1967 | Clark et al. | 174/120(FP) |
| 3,404,319 | 10/1968 | Tsuji et al. | 174/120(FP) |

*Primary Examiner*—Darrell L. Clay
*Attorney*—Popper, Bain, Bobis & Gilfillan

ABSTRACT: A cover for hermetically sealing the open end of a circuit package in which a solder border is applied to the marginal areas of the cover, and a dielectric dress is applied within the border; the dielectric dress is sufficiently thick to fit into the open end of a circuit package and to position the lid in exact registration with the circuit package.

PATENTED MAY 25 1971
3,579,817
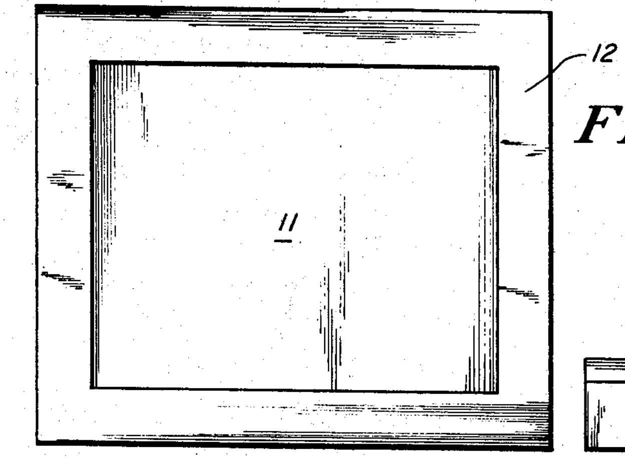
FIG. 1
FIG. 2
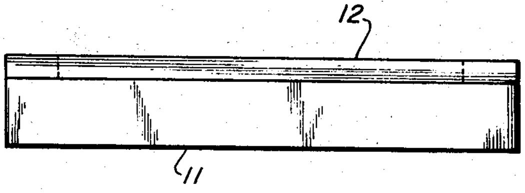
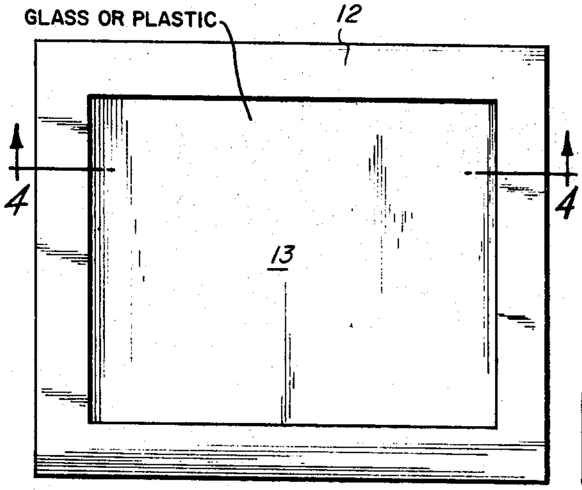
FIG. 3
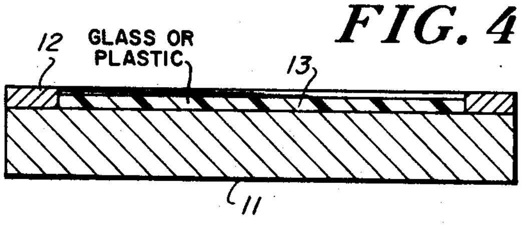
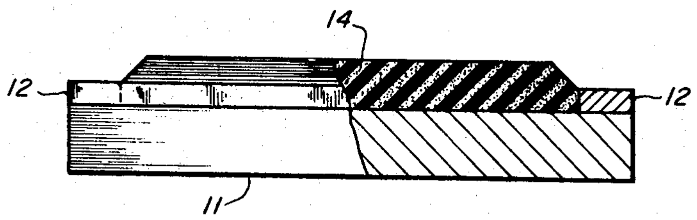
FIG. 5
INVENTOR.
MARTIN A. BOYLE
BY Popper, Bain, + Bobis
ATTORNEYS

COVER FOR COPLANAR WALLS OF AN OPEN TOP CIRCUIT PACKAGE

BACKGROUND OF THE INVENTION

1. Field of Invention

This invention relates generally to circuit packages commonly known as flat packs, and integrated circuits and particularly to a closure and a method for sealing the open face of the circuit package, comprising an electronic circuit prepared as a unit.

2. Description of Prior Art

Circuit packages such as flat packs, integrated circuits, and other electronic items are frequently prepared in a housing wherein they are positioned with suitable leads extending from the inside to the outside of the housing for establishing a circuit with the components in the housing. These circuit packages may be relatively large or extremely minute. The smaller the circuit package, the more difficult it is to apply a cover and seal it firmly in place. Such seals are preferably of hermetic character so as to exclude external contamination from the components in the package for such contamination may contribute to circuit unreliability or failure. Under present procedure, a small circuit package (and reference will be made to one, by way of example, which is one-fourth inch square) takes the form of a rectangular dielectric member having a hollow central portion and a floor to which a circuit has been applied. Suitable leads extend through the walls of the package for connection to the internal components in the package to enable them to be connected to external circuits or components. The top of the package is open and a cover has to be applied thereto, to seal in the components and protect them from internal influence. A cover is applied to the top of the package, with a solder alloy frame intruded between the cover and the circuit package. In items as small as that previously dimensionally referred to as an example (or even smaller), it is time consuming to apply the solder alloy frame and the cover to the circuit package. It is difficult and time consuming to bring the package, the solder alloy frame, and the cover into alignment, and it is difficult to maintain the alignment of the solder alloy frame and the cover with the package during the rendering of the solder alloy frame molten so that it bonds to the package and to the lid. Misalignment produces a defective package which must be discarded because the hermetic seal is defective or will become defective. In addition, means should sometimes be provided for maintaining the electrical isolation of the components from the cover of the package. Such components are frequently subject to extreme vibration under conditions of use, or they are subjected to the effect of centrifugal force which may cause deflection deflectable portions of the circuit to move, and make electrical contact with the cover. Consequently, it is desirable that the cover be provided with a dielectric surface so that the components will not establish a contact with the cover.

SUMMARY OF THE INVENTION

It has been found that a cover for a circuit package may be prepared which dispenses with the necessity for a separate solder alloy frame. It becomes unnecessary to keep three components in alignment according to the ordinary prevailing procedures, and it is easy to fuse the lid to the circuit package. Such a cover is in the form of a thin metal lid, generally dimensioned to cover and to close the top of the frame of the circuit package. The top of the circuit package usually has a metallic, electrically conductive frame attached to the package, although the top may be made of other material. A fusible alloy has been applied to or adhered to the cover in general correspondence with the frame of the circuit package. It is easy to keep this one-piece lid in alignment with even a minute circuit package for there is no separate intervening solder frame and the application of heat will cause the fusible alloy border on the lid to bond the lid to the metallic open-frame top portion of the circuit package. A complete hermetic seal is obtained. In addition, in the case of a circuit package wherein it is desirable to render the central area of the lid nonconductive, a dielectric fusible dress can be applied to the cover in the central area thereon, surrounded by the fusible alloy border. When the border alloy is fused to the circuit package, the central dielectric dress will also fuse to the central area of the cover, providing a smooth and continuous dielectric patch that will prevent deflected circuit components from shorting on the cover. It is also possible to apply the central dielectric fusible dress to the cover and fuse it to the cover before the cover is applied to and fused with the circuit package. If sufficiently high the central dielectric dress will function as a retainer for components in the circuit package.

THE DRAWINGS

FIG. 1 is a top plan view of a cover with a solder border applied;

FIG. 2 is a side elevational view of a cover with a solder border applied;

FIG. 3 is a top plan view of a cover with both a solder border and a dielectric central dress applied;

FIG. 4 is a vertical sectional view taken on the line 4—4 in FIG. 3 looking in the direction of the arrows; and FIG. 5 is a partially sectioned side elevational view of a cover having a tapered dielectric central dress higher than the solder border.

PREFERRED EMBODIMENT

Referring now to the drawings in detail, there is shown a lid 11. This lid has deposited thereon a fusible alloy border 12 extending inwardly from the edge a distance generally corresponding with the open frame of the top of a circuit package. Such open frame is usually metal. This border 12 may be applied in a molten state or it may be applied in the form of a fusible alloy in a suitable vehicle which may be brushed on, sprayed on, or screened on, or applied in any one of numerous other techniques which are well known in the industry. If applied molten, or rendered molten, the border will bond and freeze to the lid 11. If applied cool in a fluid vehicle, it is subjected to heat sufficient to fuse it to the lid 11, or at least to dry into a solid firm state. The lid 11 is then ready for application to a circuit package to which it is applied in precise registration with the open frame top of the circuit package and is subjected to heat, so that the alloy once more becomes molten and fuses with the metallic open frame of the circuit package, to seal the lid 11 thereto.

In those cases where it is desirable to provide a lid which, though electrically conductive, is nevertheless isolated from the components in the circuit package, a central dielectric fusible dress 13 is applied to the open portions of the cover not covered by the fusible alloy border. The fusible dress 13 is applied to those portions of the cover which generally correspond dimensionally to the open portion of the metallic frame on the circuit package. This fusible dielectric dress 13 may be any one of numerous dielectric materials which are standard in the industry for insulating metal surfaces from electrical contact. A low melting point glass material, or a thermosetting plastic material, or even an air-curing material can be applied to this central area to build up a layer of dielectric material. This dielectric fusible dress 14 may be built up to merely cover thinly the central area of the frame, or it can be built up thickly to extend above the border 12 (i.e. thicker than the border 12) wherein it can serve as a means for precisely automatically aligning the cover with the open frame of the circuit package, thereby making the fusing of the border to the lid accurate and simple, for the high dielectric dress 14, especially if tapered will drop into the open frame of the circuit package. In addition, the dielectric dress 14 may serve the further function, depending upon its thickness, of restraining the components of the circuit package from yielding to forces of vibration, or to centrifugal forces, which might cause them or their connecting wires to be deflected or to break under normal conditions of operation.

While the precise dimensioning of the dielectric dress 14 to correspond with the components in the circuit package may be somewhat difficult to achieve because of the random positioning and dimensioning of the components in the circuit package, the dielectric dress may advantageously take the form of an expanded plastic material, such as polyurethane foam, which can lightly be compressed by components in the package after the lid is applied and will serve to hold those components in place, and make them resistant to spacial migration under conditions of intense vibration or centrifuging. Polyurethane ordinarily does not have walls which collapse into the intersticial spaces under normal sealing temperatures and may have the further advantage of shielding the components in the circuit package from external heat or cold. Materials with a low coefficient of thermal conduction are preferred. Since the circuit pattern may be applied to a plastic material, or a ceramic material having a low coefficient of thermal conduction, it will be seen that the use of a cover with an expanded plastic central area 14 provides a package which is especially resistant to destructive external heat. The heat generated by components is ordinarily not sufficient, if conserved by environmental materials, to cause them to disintegrate. The low coefficient of thermal conduction of the dielectric dress and the base will have the further advantage of conserving any heat derived from the components or the circuit package itself so that the circuit package become resistant to deterioration due to external low-temperature conditions which might render it inoperative, or cause a destruction of some of its components.

I claim:

1. A cover for coplanar walls of an open top circuit package comprising:

a. an electrically conductive lid generally dimensioned to cover the coplanar walls of an open top circuit package, b. a fusible alloy border on the lid disposed the dielectric in general correspondence with the walls of an open top circuit package and adapted to fuse therewith, and a dielectric dress applied to the lid within the alloy border.

2. The device according to claim 1 in which the dielectric dress is thicker than the alloy border.

3. The device according to claim 1 in which the dielectric dress is thicker than the alloy border and tapers smaller from the interface with the lid to its top surface, and defines a positioning enlargement to automatically align the lid.

4. The device according to claim 1 in which the dielectric dress is fused to the lid within the marginal area defined by the alloy.

5. The device according to claim 1 in which the alloy is fused to the lid.

6. The device according to claim 1 in which both the dielectric dress and the alloy are fused to the lid.

7. The device according to claim 1 in which the dielectric dress is glass.

8. The device according to claim 1 in which the dielectric dress is compressible.

9. The device according to claim 1 in which the dielectric dress is a compressible expanded plastic foam.

10. The device according to claim 1 in which the dielectric dress has a low coefficient of thermal condition.

11. The method for positioning a lid in a circuit package including an electrical component therein and having a top opening comprising:

a. forming a lid dimensioned to fit a circuit package, b. applying a dielectric dress to the lid, dimensioned to fit into a top opening of a circuit package when the lid is in registration with the top of the circuit package, c. inserting the dielectric dress on the lid into the circuit package, whereby the lid will automatically be positioned in registration with the top of the circuit package, and d. leading the lid to the package.

UNITED STATES PATENT OFFICE
CERTIFICATE OF CORRECTION

Patent No. 3,579,817 Dated May 25, 1971

Inventor(s) Martin A. Boyle

It is certified that error appears in the above-identified patent and that said Letters Patent are hereby corrected as shown below:

Column 3, line 35, "the dielectric" should read -- marginally --. Column 4, line 23, "condition" should read -- conduction --; line 35, "leading" should read -- bonding --.

Signed and sealed this 14th day of September 1971.

(SEAL)
Attest:

EDWARD M.FLETCHER,JR.
Attesting Officer

ROBERT GOTTSCHALK
Acting Commissioner of Patents